United States Patent
Mikalo et al.

(10) Patent No.: US 8,669,170 B2
(45) Date of Patent: Mar. 11, 2014

(54) METHODS OF REDUCING GATE LEAKAGE

(75) Inventors: Ricardo P. Mikalo, Heideblick (DE);
Stefan Flachowsky, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 96 days.

(21) Appl. No.: 13/350,891

(22) Filed: Jan. 16, 2012

(65) Prior Publication Data

US 2013/0183817 A1 Jul. 18, 2013

(51) Int. Cl.
*H01L 21/425* (2006.01)
(52) U.S. Cl.
USPC ............................ 438/525; 438/302; 438/595
(58) Field of Classification Search
USPC .......... 438/151, 162, 287, 302, 525, 585, 595
See application file for complete search history.

(56) References Cited

U.S. PATENT DOCUMENTS

| 6,268,272 | B1 * | 7/2001 | Jang ............................ 438/592 |
| 6,620,714 | B2 * | 9/2003 | Su et al. ...................... 438/585 |
| 6,943,098 | B2 * | 9/2005 | Yeh et al. ..................... 438/525 |
| 2005/0009217 | A1 | 1/2005 | Sonderman et al. |
| 2006/0246641 | A1 | 11/2006 | Kammler et al. |
| 2006/0246657 | A1 | 11/2006 | Kim et al. |
| 2007/0063279 | A1 | 3/2007 | Tolchinsky et al. |
| 2010/0099230 | A1 | 4/2010 | Tai et al. |
| 2010/0248436 | A1 | 9/2010 | Lee et al. |

* cited by examiner

*Primary Examiner* — Kevin M Picardat
(74) *Attorney, Agent, or Firm* — Amerson Law Firm, PLLC

(57) ABSTRACT

Disclosed herein are various methods of reducing gate leakage in semiconductor devices such as transistors. In one example, a method disclosed herein includes performing an etching process to define a gate insulation layer of a transistor, wherein the gate insulation layer has an etched edge, performing an angled ion implantation process to implant ions into the gate insulation layer proximate the etched edge of the gate insulation layer and, after performing the angled ion implantation process, performing an anneal process.

23 Claims, 4 Drawing Sheets

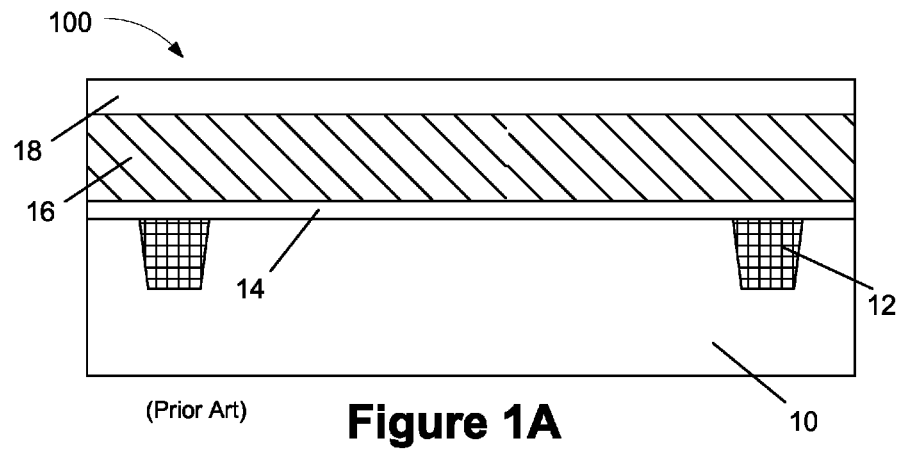
(Prior Art) Figure 1A
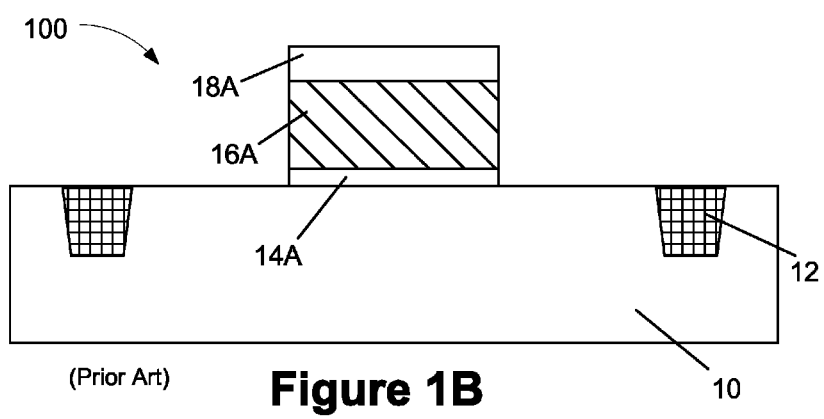
(Prior Art) Figure 1B
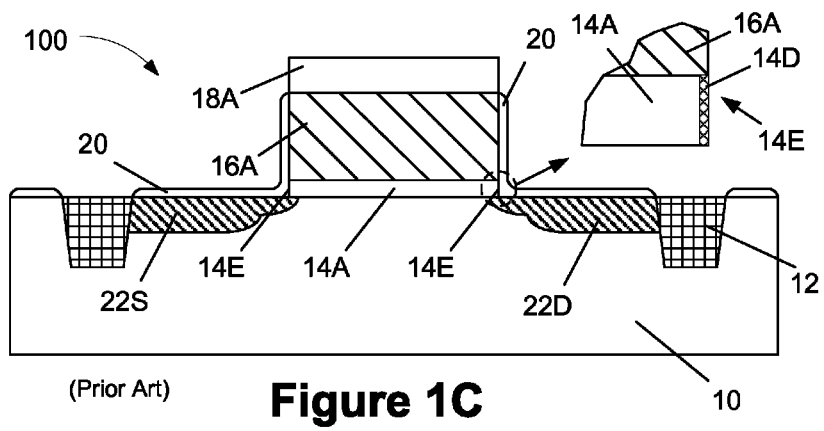
(Prior Art) Figure 1C

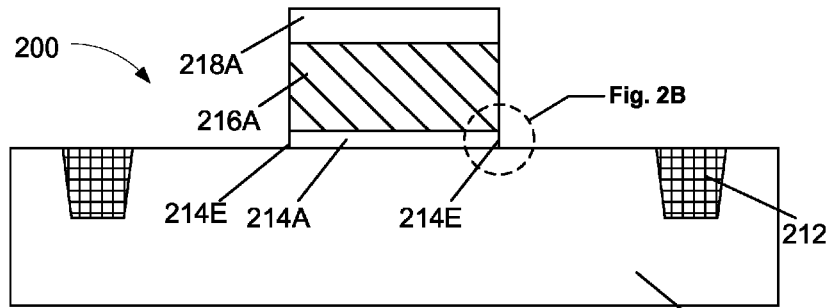
Figure 2A
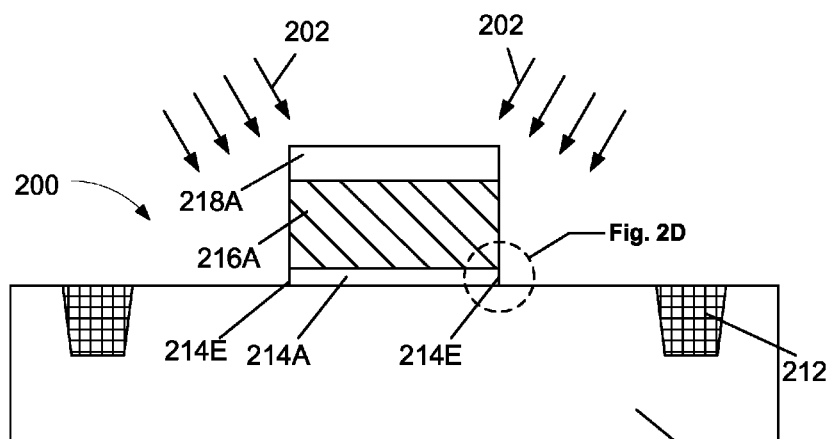
Figure 2C
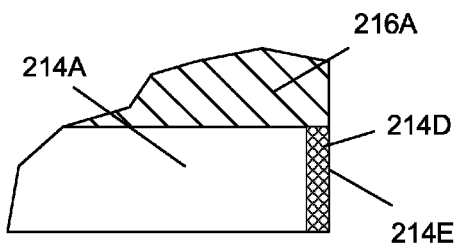 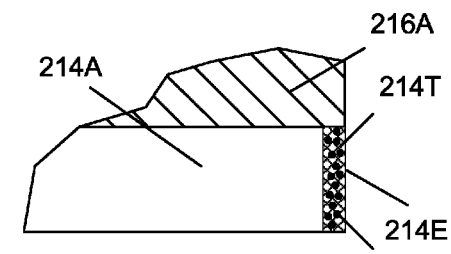
Figure 2B  Figure 2D

METHODS OF REDUCING GATE LEAKAGE

BACKGROUND OF THE INVENTION

1. Field of the Invention

Generally, the present disclosure relates to the manufacturing of sophisticated semiconductor devices, and, more specifically, to various methods of reducing gate leakage in semiconductor devices such as transistors.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit element that substantially determines performance of the integrated circuits. During the fabrication of complex integrated circuits using, for instance, MOS technology, millions of transistors, e.g., NMOS transistors and/or PMOS transistors, are formed on a substrate including a crystalline semiconductor layer. A field effect transistor, irrespective of whether an NMOS transistor or a PMOS transistor is considered, typically comprises so-called PN junctions that are formed by an interface of highly doped regions, referred to as drain and source regions, with a slightly doped or non-doped region, such as a channel region, disposed between the highly doped source/drain regions. The channel length of a MOS transistor is generally considered to be the lateral distance between the source/drain regions.

FIGS. 1A-1C depict portions of an illustrative process flow for forming the gate structure of an illustrative prior art transistor device 100. The process typically begins with the formation of an illustrative trench isolation structure 12 in a semiconducting substrate 10. The isolation structure 12 defines an active area in the substrate 10 where the transistor 100 will be formed. The basic gate formation process begins with the formation of multiple layers of material above the substrate 10. In the depicted example, a gate insulation layer 14 (e.g., silicon dioxide), a layer of gate electrode material 16 (e.g., polysilicon) and a gate capping material layer 18 (e.g., silicon nitride) are formed above the substrate 10 using known processing techniques. Thereafter, with reference to FIG. 1B, a patterned masking layer (not shown), such as a photoresist mask, is formed above the gate capping layer 18 and one or more etching processes are performed through the patterned mask layer to define a gate insulation layer 14A, a gate electrode 16A and a gate cap 18A, as depicted in FIG. 1B. Next, as shown in FIG. 1C, a relatively high temperature (about 950° C.) gate re-oxidation process is performed that results in the formation of an illustrative layer of silicon dioxide 20. An illustrative source region 22S and drain region 22D are also formed in the substrate 10 by using known ion implantation tools and techniques. Of course, as will be appreciated by those skilled in the art, there are numerous additional steps that need to be performed to complete the fabrication of the illustrative transistor 100, e.g., the formation of so-called halo implant regions in the substrate 10, the formation of one or more sidewall spacers proximate the gate electrode 16A, the formation of various conductive contacts to establish electrical connection to the device 100, etc.

Depending upon the operation conditions, i.e., whether the transistor 100 is turned "ON" or "OFF," there will be undesirable leakage current between the gate electrode 16A and one or both of the illustrative source/drain regions 22S, 22D formed in the substrate 10. This gate leakage current can be separated into two different categories—an area leakage component and a boundary leakage component. The area leakage component is based upon the contact area between the gate insulation layer 14A and the surface of the substrate 10. To reduce the gate leakage current due to this area leakage component, device designers have taken several actions, such as using so-called high-k (k value greater than 10) insulating materials for the gate insulation layer 14A.

The boundary leakage component occurs at the edges 14E of the gate insulation layer 14A around the perimeter of the gate insulation layer 14A, particularly along the edges 14E that extend in the gate width direction (i.e., into the drawing page shown in FIG. 1C). When the transistor 100 is "OFF," gate boundary leakage occurs between the gate electrode 16A and the drain region 22D; when the transistor 100 is "ON," gate boundary leakage occurs between the gate electrode 16A and both the source region 22S and the drain region 22D. The act of patterning the gate insulation layer 14A and the gate electrode 16A results in a damaged region 14D proximate the etched edges 14E of the gate insulation layer 14A, as depicted in the enlarged insert shown in FIG. 1C. This relatively vertically-oriented damaged region 14D consists of unsaturated and dangling bonds which create a two-dimensional density of states that provides an electrical conduction path for current flow between the gate electrode 16A and the source/drain regions 22S, 22D. Traditionally, device designers have performed the previously described, relatively high temperature (about 950° C.) gate re-oxidation process in an effort to re-crystallize the damaged region 14D to try to reduce the boundary component of the gate leakage current. However, modern transistor devices typically do not have sufficient "thermal budget" to allow for such a high temperature re-oxidation process to be performed. Accordingly, the boundary component of the gate leakage current is becoming more problematic in modern, high-performance transistor devices.

The present disclosure is directed to various methods of reducing gate leakage in semiconductor devices such as transistors that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of reducing gate leakage in semiconductor devices such as transistors. In one example, a method disclosed herein includes performing an etching process to define a gate insulation layer of a transistor, wherein the gate insulation layer has an etched edge, performing an angled ion implantation process to implant ions into the gate insulation layer proximate the etched edge of the gate insulation layer and, after performing the angled ion implantation process, performing an anneal process.

BRIEF DESCRIPTION OF THE DRAWINGS

The disclosure may be understood by reference to the following description taken in conjunction with the accompanying drawings, in which like reference numerals identify like elements, and in which:

FIGS. 1A-1C depict one illustrative process flow for forming a prior art transistor device; and FIGS. 2A-2G depict various illustrative methods disclosed herein for reducing gate leakage in semiconductor devices.

Figure 2E:
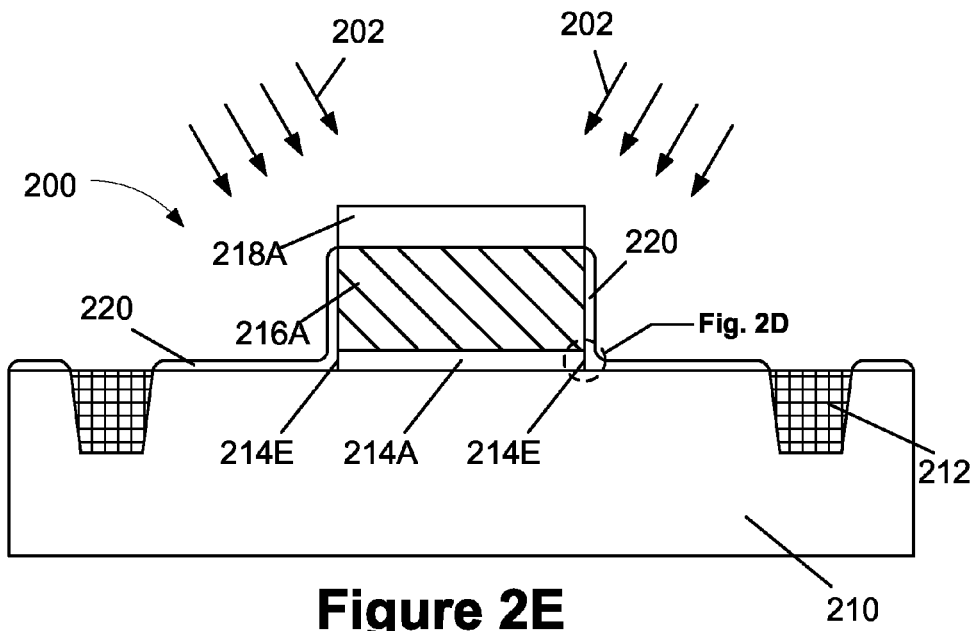

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of reducing gate leakage in semiconductor devices such as transistors. As will be readily apparent to those skilled in the art upon a complete reading of the present application, the present method is applicable to a variety of devices, e.g., NMOS, PMOS, CMOS, etc., and is readily applicable to a variety of integrated circuit products, including, but not limited to, ASIC's, logic devices, memory devices, etc. With reference to the attached drawings, various illustrative embodiments of the methods disclosed herein will now be described in more detail.

FIG. 2A is a simplified view of an illustrative transistor device 200 at an early stage of manufacturing. The transistor is formed in and above an active area defined by an illustrative trench isolation structure 212 that is formed in a semiconducting substrate 210. The substrate 210 may have a variety of configurations, such as the depicted bulk silicon configuration. The substrate 210 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 210 may also be made of materials other than silicon.

At the point of fabrication depicted in FIG. 2A, an illustrative gate structure comprised of a gate insulation layer 214A and a gate electrode 216A, as well as a gate cap layer 218A have been formed above the substrate 210. The gate insulation layer 214A, gate electrode 216A and the gate cap layer 218A may be formed using traditional techniques. For example, various layers of material that correspond to the gate insulation layer 214A, gate electrode 216A and the gate cap layer 218A may be formed above the substrate 210 by performing one or more deposition and or thermal growth processes. Thereafter, a patterned masking layer (not shown), such as a photoresist mask, is formed above the various layers of material, and one or more etching processes are performed through the patterned masking layer to define the gate insulation layer 214A, the gate electrode 216A and the gate cap 218A, as depicted in FIG. 2A. As described in the background section of this application, etching processes performed to define the gate insulation layer 214A and the gate electrode 216A result in a damaged region 214D (see FIG. 2B) proximate the etched edges 214E of the gate insulation layer 214A. This relatively vertically-oriented damaged region 214D consists of unsaturated and dangling bonds which create a two-dimensional density of states that provides an electrical conduction path for current flow between the gate electrode 216A and the source/drain regions that will be formed in the substrate 210 proximate the gate structure of the transistor 200.

According to the present disclosure, as shown in FIG. 2C, an angled ion implantation process 202 that is directed at the etched edges 214E of the gate insulation layer 214A is performed on the transistor device 200. The angled ion implantation process 202 may be performed at any time after the gate insulation layer 214A and the gate electrode 216A have been formed. In the illustrative example depicted in FIG. 2C, the ion implantation process 202 is performed after the gate structure, i.e., the gate insulation layer 214A and the gate electrode 216A, is formed and prior to any re-oxidation or re-crystallization anneal process is performed on the device 200. The details of the ion implantation process 202, such as the material implanted, the implant dose, implant angle and implant energy, may vary depending on the particular application. In one illustrative embodiment, materials, such as nitrogen, oxygen, silicon, carbon, chlorine, fluorine, a noble gas (argon, neon, etc.), xenon, di-nitrogen ($N_2$), etc., and compounds thereof may be implanted during the implantation process 202. In general, according to one aspect of the subject matter disclosed herein, the ion implantation process may be performed with a material that is not an N-type or P-type dopant material. In one illustrative example, the ion implantation process 202 may be performed at a dose that ranges from about $1 e^{14}$-$1 e^{16}$ ions/cm$^2$, at an energy level that ranges from about 0.5-10 keV and a tilt angle (relative to a vertical axis) that may range from about 3-20 degrees. In one particularly illustrative example, the ion implantation process 202 may be performed by performing a quad implant process using nitrogen at a dose of about $1 e^{15}$ ions/cm$^2$ and at an energy level of about 5 keV, with a tilt angle of about 15° (relative to a vertical axis), with a 45° twist.

As shown in FIG. 2D, the ion implantation process 202 results in the implantation of ions 202A at least into portions of the damaged regions 214D and thereby defines an implanted region 214T proximate the etched edges 214E of the gate insulation layer 214A. As depicted, the implanted region 214T comprises at least some of the implanted ions 202A. Eventually, an anneal process will be performed on the device 200 after the ion implantation process is performed. In one illustrative embodiment, this anneal process should be performed at a temperature of at least 750° C. for a duration of about 5 seconds. The implanted ions 202A are free to bond with any dangling bonds in the damaged region 214D, thereby reducing the density of states which tend to reduce the effectiveness of any potential conductive path between the gate electrode 216A and the source/drain regions that will be formed in the substrate 210. Additionally, due to the implant energy of the ion implantation process 202, the ions 202A tend to disrupt the relatively ordered nature of the lattice structure in the damaged region 214D. This disruption tends to make any conductive path through the damaged regions 214D less conductive.

Figure 2F:
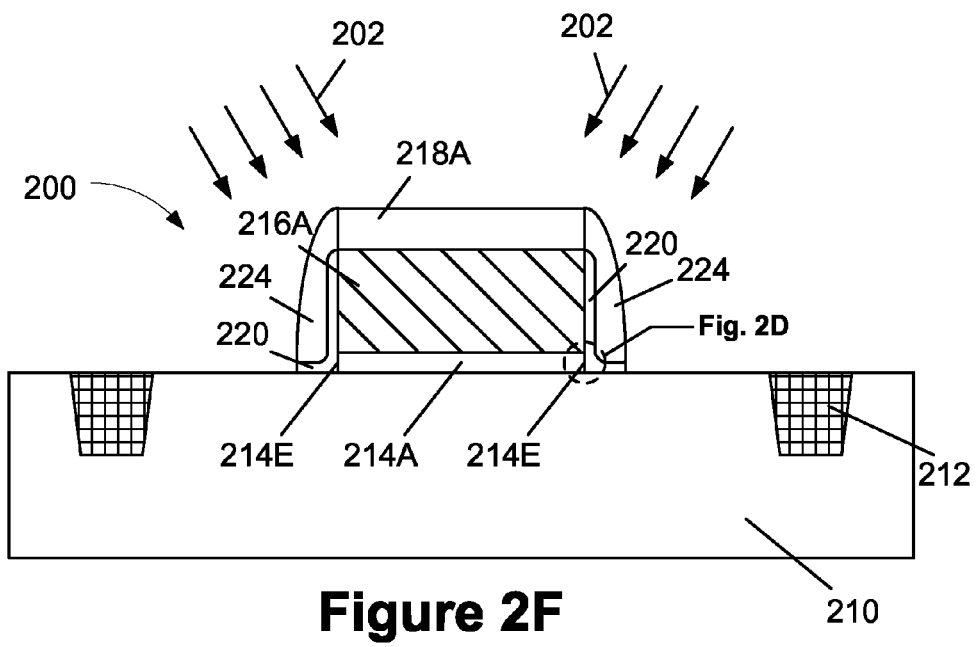

As noted previously, the ion implantation process 202 may be performed at any time after the basic gate structure, i.e., the gate insulation layer 214A and the gate electrode 216A, are formed by performing one or more etching processes. FIG. 2E depicts an illustrative example wherein the ion implantation process 202 is performed after a relatively low-temperature gate re-oxidation process (T<900° C.) to thereby form an illustrative oxide layer 220 having a thickness of about 1.5 nm. In some embodiments, the layer 220 may be formed by performing a conformal deposition process. FIG. 2F depicts the illustrative example wherein the ion implantation process 202 is performed after illustrative sidewall spacers 224 are formed proximate the gate electrode 216A of the transistor device 200. The sidewall spacers 224 may be formed by depositing a layer of spacer material, e.g., silicon nitride, and thereafter performing an anisotropic etching process. In one illustrative example, the spacers 224 may be relatively thin, e.g., about 20 nm. In general, it is believed that the ion implantation process 202 is likely to be less effective the greater the amount of material that is present between the edge 214E of the gate insulation layer 214A and the ion implant tool. However, performing the ion implantation process 202 through a relatively thin layer of material, such as the illustrative oxide layer 220, should produce acceptable results.

Figure 2G:
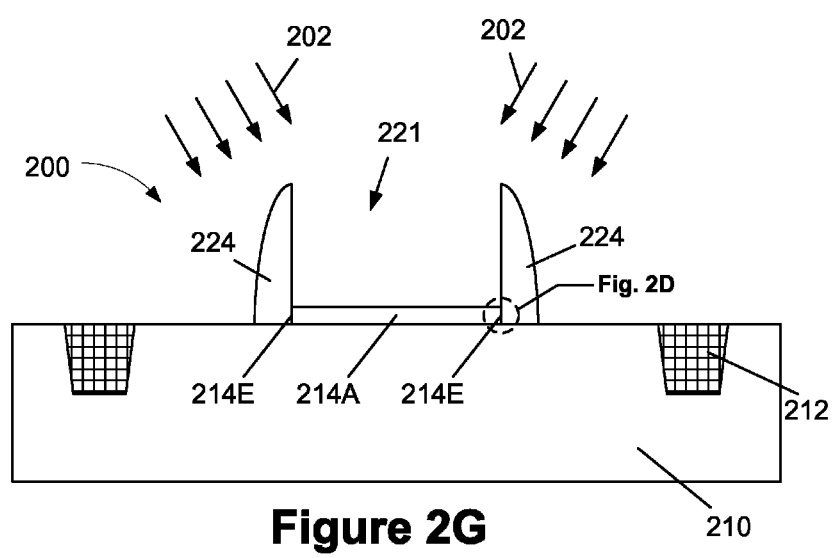

FIG. 2G depicts the illustrative example where the methods disclosed herein may be employed in cases where the gate structure of the device 200 is formed by performing so-called "gate last" techniques. In general, the "gate-last" technique involves forming a so-called dummy gate insulation layer and a dummy gate electrode that may be similar in structure to the gate insulation layer 214A and the gate electrode 216A. Typically, the dummy gate insulation layer and the dummy gate electrode layer are removed and replaced with a replacement gate structure that is comprised of a final gate insulation layer and one or more metal layers that serve as the gate electrode for the device. However, in some applications, the dummy gate insulation layer is not removed in a gate-last process. For example, at the point of processing depicted in FIG. 2G, a gate cavity 221 between sidewall spacers 224 has been formed above the gate insulation layer 214A by performing an etching process to remove the gate electrode 216A. Thereafter, in one illustrative example, the angled ion implantation process 202 is performed through the gate cavity 221 to implant ions 202A into the damaged regions 214D proximate the etched edges 214E of the gate insulation layer 214A. As before, a subsequent anneal process may be performed on the device 200 to cause the implanted ions 202A to bond with the dangling bonds in the damaged region 214D.

In one illustrative example, where the presently disclosed methods were employed on an illustrative transistor device 200 as depicted in FIG. 2E, a reduction in the boundary component of the gate leakage current was reduced by a factor of about 1.5. In this example, the gate insulation layer 214A of the transistor 200 was a 2 nm thick layer of nitride silicon dioxide that was formed by performing a thermal growth process and a subsequent decoupled plasma nitridation process. The gate electrode 216A of the transistor 200 was made of polysilicon. After the gate electrode 216A and the gate insulation layer 214A were defined by performing an etching process, a low temperature oxidation process (T<800° C.) was performed on the device 200, which resulted in the formation of the oxide layer 220 depicted in FIG. 2E. Thereafter, an ion implantation process 202 was performed to introduce ions into the damaged region 214D proximate the etched edges 214E of the gate insulation layer 214A. In this illustrative example, the ion implantation process 202 was a quad implant process using nitrogen at a dose of about $1\ e^{15}$ ions/cm$^2$ and at an energy level of about 5 keV, with a tilt angle of about 15° (relative to a vertical axis), with a 45° twist. Thereafter, a laser anneal process was performed at a temperature of about 1200° C. for a duration of about 1 ms to cause the implanted ions 202A to bond with the dangling bonds in the damaged regions 214D of the gate insulation layer. Both an NMOS and PMOS device were treated as described above and compared to untreated versions of the NMOS and PMOS device, respectively. For the illustrative NMOS device, the methods disclosed herein resulted in the reduction of the gate boundary leakage from about 140 pA/μm (for the untreated NMOS device) to about 100 pA/μm for the NMOS device on which the ion implantation process described above was performed. For the illustrative PMOS device, the methods disclosed herein resulted in the reduction of the gate boundary leakage from about 55 pA/μm (for the untreated PMOS device) to about 35 pA/μm for the PMOS device on which the ion implantation process described above was performed. However, the methods disclosed herein did result in a slightly higher overlap capacitance, but the increase in the overlap capacitance was not significant as compared to the reduction in gate leakage current achieved using the methods disclosed herein.

The various components and structures of the device 200 disclosed herein may be formed using a variety of different materials and by performing a variety of known techniques. For example, the gate insulation layer 214A may be comprised of a variety of different insulating materials, e.g., silicon dioxide, a so-called high-k insulating material (k value greater than 10). The gate electrode 216A may be comprised of polysilicon or it may contain at least one metal layer. The gate structure of the transistor 200 may be made using so-called "gate first" or "gate last" techniques. The sidewall spacers 224 may be comprised of a variety of materials, such as silicon nitride.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    performing an etching process to define a gate structure comprising a gate insulation layer of a transistor and a gate electrode positioned above said gate insulation layer, said gate electrode comprising sidewalls and said gate insulation layer having an etched edge;
    forming an oxide layer on said sidewalls of said gate electrode;
    after forming the oxide layer on said sidewalls of said gate electrode, performing an angled ion implantation process to implant ions into said gate insulation layer proximate said etched edge of said gate insulation layer; and
    after performing said angled ion implantation process, performing an anneal process.

2. The method of claim 1, wherein said ions are comprised of a material other than an N-type dopant or a P-type dopant.

3. The method of claim 1, wherein said ions are comprised of at least one of nitrogen, oxygen, silicon, carbon, chlorine, fluorine, xenon, di-nitrogen, germanium, a noble gas or compounds thereof.

4. The method of claim 1, wherein said ion implantation process is performed with a dose that ranges from about 1 $e^{14}$-1 $e^{16}$ ions/cm$^2$, at an energy level that ranges from about 0.5-10 keV and a tilt angle that may range from about 3-20 degrees.

5. The method of claim 1, wherein said ion implantation process is performed using nitrogen at a dose of about 1 $e^{15}$ ions/cm$^2$ and at an energy level of about 5 keV, with a tilt angle of about 15 degrees.

6. The method of claim 1, wherein said anneal process is performed at a temperature of at least 750° C. for a duration of at least 5 seconds.

7. The method of claim 1, wherein said gate insulation layer is comprised of at least one of silicon dioxide, a low-k (k value less than 3) insulating material or a high-k (k greater than 10) insulating material.

8. The method of claim 1, wherein said ion implantation process is directed toward said etched edge of said gate insulation layer.

9. The method of claim 1, wherein said etched edge of said gate insulation layer exhibits a gate leakage current comprising an initial boundary component and wherein performing said anneal process comprises performing the anneal process at a temperature of 750° C. or more for the duration of at least 5 seconds to produce a gate insulation layer that exhibits a reduced boundary component that is reduced by a factor of 1.5 or more compared to the initial boundary component.

10. A method, comprising:
    performing an etching process to define a gate structure comprising a gate insulation layer of a transistor and a gate electrode positioned above said gate insulation layer, said gate electrode comprising sidewalls and said gate insulation layer having an etched edge;
    forming an oxide layer on said sidewalls of said gate electrode;
    after forming said oxide layer on said sidewalls of said gate electrode, performing an angled ion implantation process directed at said etched edge to implant ions into said gate insulation layer proximate said etched edge of said gate insulation layer; and
    after performing said angled ion implantation process, performing an anneal process at a temperature of at least 750° C.

11. The method of claim 10, wherein said anneal process is a laser anneal process performed at a temperature of at least 1000° C.

12. The method of claim 10, wherein said ions are comprised of a material other than an N-type dopant or a P-type dopant.

13. The method of claim 10, wherein said ion implantation process is performed with a dose that ranges from about 1 $e^{14}$-1 $e^{16}$ ions/cm$^2$, at an energy level that ranges from about 0.5-10 keV and a tilt angle that may range from about 3-20 degrees.

14. The method of claim 10, wherein said ions are comprised of at least one of nitrogen, oxygen, silicon, carbon, chlorine, fluorine, xenon, di-nitrogen, germanium, a noble gas or compounds thereof.

15. The method of claim 10, wherein said etched edge of said gate insulation layer exhibits a gate leakage current comprising an initial boundary component and wherein performing said anneal process comprises performing the anneal process at a temperature of 750° C. or more for the duration of at least 5 seconds to produce a gate insulation layer that exhibits a reduced boundary component that is reduced by a factor of 1.5 or more compared to the initial boundary component.

16. A method, comprising:
    performing an etching process to define a gate structure comprising a gate insulation layer of a transistor and a gate electrode positioned above said gate insulation layer, said gate electrode comprising sidewalls and said gate insulation layer having an etched edge;
    forming an oxide layer on said sidewalls of said gate electrode;
    after forming said oxide layer on said sidewalls of said gate electrode, performing an angled ion implantation process directed at said etched edge to implant ions into said gate insulation layer proximate said etched edge of said gate insulation layer, said ion implantation process performed with a dose that ranges from about 1 $e^{14}$-1 $e^{16}$ ions/cm$^2$, at an energy level that ranges from about 0.5-10 keV and a tilt angle that may range from about 3-20 degrees; and
    after performing said angled ion implantation process, performing an anneal process at a temperature of at least 1000° C.

17. The method of claim 16, wherein said ions are comprised of a material other than an N-type dopant or a P-type dopant.

18. The method of claim 17, wherein said ions are comprised of at least one of nitrogen, oxygen, silicon, carbon, chlorine, fluorine, xenon, di-nitrogen, germanium, a noble gas or compounds thereof.

19. The method of claim 16, wherein said etched edge of said gate insulation layer exhibits a gate leakage current comprising an initial boundary component and wherein performing said anneal process comprises performing the anneal process at a temperature of 750° C. or more for the duration of at least 5 seconds to produce a gate insulation layer that exhibits a reduced boundary component that is reduced by a factor of 1.5 or more compared to the initial boundary component.

20. A method, comprising:
    performing at least one etching process to define a gate structure comprising a gate insulation layer of a transistor and a gate electrode positioned above said gate insulation layer, said gate electrode comprising exposed etched sidewalls and said gate insulation layer having an etched edge;
    performing an angled ion implantation process to implant ions into said exposed etched sidewalls of said gate electrode and into said gate insulation layer proximate said etched edge of said gate insulation layer;

after performing said angled ion implantation process, performing an anneal process, producing annealed, exposed etched sidewall edges of said gate electrode; and after performing said anneal process, forming a layer of material at least on and in contact with said annealed, exposed sidewall edges of said gate electrode.

21. The method of claim 20, wherein said implanted ions are comprised of a material other than an N-type dopant or a P-type dopant.

22. The method of claim 20, wherein said anneal process is performed at a temperature of at least 750° C. for a duration of at least 5 seconds.

23. The method of claim 20, wherein said angled ion implantation process is directed toward said etched edge of said gate insulation layer.

* * * * *